United States Patent
Lin et al.

(10) Patent No.: US 6,551,915 B2
(45) Date of Patent: Apr. 22, 2003

(54) THERMAL ANNEALING/HYDROGEN CONTAINING PLASMA METHOD FOR FORMING STRUCTURALLY STABLE LOW CONTACT RESISTANCE DAMASCENE CONDUCTOR STRUCTURE

(75) Inventors: Jing-Cheng Lin, Chu-Tung Zhen (TW); Shau-Lin Shue, Hsinchu (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/898,980

(22) Filed: Jul. 3, 2001

(65) Prior Publication Data

US 2003/0008497 A1 Jan. 9, 2003

(51) Int. Cl.$^7$ ............................................... H01L 21/44
(52) U.S. Cl. ...................... 438/598; 438/633; 438/597; 438/738; 438/618; 438/637; 438/638; 438/689; 438/695
(58) Field of Search ................................. 438/598, 633, 438/597, 738, 618, 637, 638, 689, 695, 700, 704, 710, 745

(56) References Cited

U.S. PATENT DOCUMENTS

| | | | | |
|---|---|---|---|---|
| 5,930,669 A | * | 7/1999 | Uzoh | 438/627 |
| 6,057,239 A | * | 5/2000 | Wang et al. | 438/689 |
| 6,071,806 A | | 6/2000 | Wu et al. | |
| 6,103,619 A | * | 8/2000 | Lai | 438/622 |
| 6,114,250 A | | 9/2000 | Ellingboe et al. | |
| 6,140,241 A | * | 10/2000 | Shue et al. | 205/222 |
| 6,235,633 B1 | * | 5/2001 | Jang | 438/627 |
| 6,268,294 B1 | * | 7/2001 | Jang et al. | 438/706 |
| 6,271,084 B1 | * | 8/2001 | Tu et al. | 438/240 |
| 6,277,733 B1 | * | 8/2001 | Smith | 438/636 |
| 6,323,121 B1 | * | 11/2001 | Liu et al. | 430/314 |
| 6,326,300 B1 | * | 12/2001 | Liu et al. | 438/638 |
| 6,326,302 B1 | * | 12/2001 | Joubert et al. | 438/638 |
| 6,333,255 B1 | * | 12/2001 | Sekiguchi | 257/758 |
| 6,372,583 B1 | * | 4/2002 | Tyagi | 438/269 |
| 6,413,852 B1 | * | 7/2002 | Grill et al. | 438/618 |
| 6,413,856 B1 | * | 7/2002 | Lou | 438/618 |
| 6,424,038 B1 | * | 7/2002 | Bao et al. | 257/741 |

\* cited by examiner

*Primary Examiner*—Matthew Smith
*Assistant Examiner*—V. Yevsikov
(74) *Attorney, Agent, or Firm*—Tung & Associates

(57) ABSTRACT

Within a damascene method for forming a patterned conductor layer within an aperture defined by a patterned dielectric layer within a microelectronic fabrication, at least one of: (1) the patterned dielectric layer is thermally annealed at a temperature of from about 300 to about 450 degrees centigrade prior to forming within the aperture the patterned conductor layer; and (2) the aperture is etched with a plasma employing an etchant gas composition comprising hydrogen to form a laterally enlarged aperture prior to forming within the laterally enlarged aperture the patterned conductor layer. In accord with the method, the microelectronic fabrication is formed with decreased contact resistance and enhanced structural integrity.

20 Claims, 1 Drawing Sheet

THERMAL ANNEALING/HYDROGEN CONTAINING PLASMA METHOD FOR FORMING STRUCTURALLY STABLE LOW CONTACT RESISTANCE DAMASCENE CONDUCTOR STRUCTURE

BACKGROUND OF THE INVENTION

1. Field of the Invention

The present invention relates generally to damascene methods for forming conductor structures within microelectronic fabrications. More particularly, the present invention relates to damascene methods for forming structurally stable low contact resistance conductor structures within microelectronic fabrications.

2. Description of the Related Art

Microelectronic fabrications are formed from microelectronic substrates over which are formed patterned microelectronic conductor structures which are separated by microelectronic dielectric structures.

As microelectronic fabrication integration levels have increased and patterned microelectronic conductor structure dimensions have decreased, it has become increasingly common in the art of microelectronic fabrication to employ when fabricating microelectronic fabrications patterned microelectronic conductor structures formed of copper containing conductor materials, which in turn are separated by microelectronic dielectric structures formed of comparatively low dielectric constant dielectric materials (i.e., dielectric materials having a dielectric constant of less than about 4.0, in comparison with more conventional dielectric materials having a dielectric constant of greater than about 4.0). Similarly, the foregoing microelectronic conductor structures and microelectronic dielectric structures are generally formed within microelectronic fabrications while employing damascene methods, and in particular dual damascene methods.

Patterned microelectronic conductor structures formed of copper containing conductor materials are desirable in the art of microelectronic fabrication insofar as copper containing conductor materials are generally recognized as providing superior electrical conductivity in comparison with other conductor materials which may be employed for forming microelectronic conductor structures within microelectronic fabrications, such as but not limited to aluminum containing conductor materials which may alternatively be employed for forming microelectronic conductor structures within microelectronic fabrications.

In addition, microelectronic dielectric structures formed of comparatively low dielectric constant dielectric materials are desirable in the art of microelectronic fabrication insofar as comparatively low dielectric constant dielectric materials typically provide microelectronic fabrications with enhanced microelectronic fabrication speed, attenuated patterned microelectronic conductor structure parasitic capacitance and attenuated patterned microelectronic conductor structure cross-talk.

Finally, damascene methods are desirable within the art of microelectronic fabrication for forming patterned microelectronic conductor structures separated by microelectronic dielectric structures within microelectronic fabrications insofar as damascene methods may often be employed to form patterned microelectronic conductor structures separated by microelectronic dielectric structure within microelectronic fabrications with fewer process steps, such as to provide patterned microelectronic conductor structures separated by microelectronic dielectric structures which may not otherwise be readily formed within microelectronic fabrications.

While microelectronic fabrications formed of patterned microelectronic conductor structures formed of copper containing conductor materials separated by microelectronic dielectric structures formed of comparatively low dielectric constant dielectric materials, as formed employing damascene methods, are thus desirable in the art of microelectronic fabrication, such microelectronic fabrications formed of microelectronic conductor structures formed of copper containing conductor materials separated by microelectronic dielectric structures formed of comparatively low dielectric constant dielectric materials are nonetheless not entirely without problems in the art of microelectronic fabrication.

In that regard, it is known in the art of microelectronic fabrication that microelectronic fabrications formed of microelectronic conductor structures formed of copper containing conductor materials separated by microelectronic dielectric structures formed of comparatively low dielectric constant dielectric materials, as formed employing damascene methods, are often difficult to fabricate with decreased contact resistance and with enhanced structural integrity, in particular of the microelectronic conductor structures.

It is thus desirable in the art of microelectronic fabrication to fabricate microelectronic fabrications having formed therein patterned microelectronic conductor structures formed of copper containing conductor materials separated by microelectronic dielectric structures formed of comparatively low dielectric constant dielectric materials, while employing damascene methods, to provide the microelectronic fabrications with decreased contact resistance and enhanced structural integrity.

It is towards the foregoing object that the present invention is directed.

Various methods have been disclosed in the art of microelectronic fabrication for fabricating, with desirable properties, microelectronic fabrications within the art of microelectronic fabrication.

Included among the methods, but not limiting among the methods, are methods disclosed by: (1) Wu et al., in U.S. Pat. No. 6,071,806 (a dual damascene method for forming, with decreased contact resistance within a microelectronic fabrication, a contiguous patterned conductor interconnect and patterned conductor stud layer within a corresponding trench contiguous with a corresponding via defined within a microelectronic dielectric layer formed of a comparatively low dielectric constant dielectric material by first exposing the sidewalls and floor of the trench contiguous with the via to an electron beam treatment prior to forming therein the contiguous patterned conductor interconnect and patterned conductor stud layer); and (2) Ellingboe et al., in U.S. Pat. No. 6,114,250 (a plasma etch method for forming within a microelectronic fabrication a patterned dielectric layer of a comparatively low dielectric constant dielectric material, where the patterned dielectric layer of the comparatively low dielectric constant dielectric material may be employed for forming a dual damascene structure within the microelectronic fabrication, and where the plasma etch method employs an etchant gas composition comprising hydrogen and nitrogen).

Desirable in the art of microelectronic fabrication are additional damascene methods for forming within microelectronic fabrications patterned microelectronic conductor structures separated by microelectronic dielectric structures, with decreased contact resistance and enhanced structural integrity.

It is towards the foregoing object that the present invention is directed.

SUMMARY OF THE INVENTION

A first object of the present invention is to provide a damascene method for forming within a microelectronic fabrication a patterned conductor layer.

A second object of the present invention is to provide the damascene method in accord with the first object of the present invention, wherein the patterned conductor layer is formed with decreased contact resistance and increased structural integrity.

A third object of the present invention is to provide the damascene method in accord with the first object of the present invention and the second object of the present invention, wherein the damascene method is readily commercially implemented.

In accord with the objects of the present invention, there is provided by the present invention a damascene method for forming a patterned conductor layer within a microelectronic fabrication.

To practice the method of the present invention, there is first provided a substrate. There is then formed over the substrate a blanket first dielectric layer. There is then patterned the blanket first dielectric layer to form a patterned first dielectric layer which defines an aperture. Finally, there is then formed into the aperture a patterned conductor layer while employing a damascene method. Within the present invention, at least one of: (1) the patterned first dielectric layer is thermally annealed at a temperature of from about 300 to about 450 degrees centigrade prior to forming within the aperture the patterned conductor layer; and (2) the aperture is etched with a plasma employing an etchant gas composition comprising hydrogen to form a laterally enlarged aperture prior to forming within the laterally enlarged aperture the patterned conductor layer.

The present invention provides a damascene method for forming a patterned conductor layer within a microelectronic fabrication, wherein the patterned conductor layer is formed with decreased contact resistance and increased structural integrity.

The present invention realizes the foregoing object within the context of the damascene method for forming the patterned conductor layer by undertaking within the damascene method at least one of: (1) a thermal annealing of a patterned dielectric layer at a temperature of from about 300 to about 450 degrees centigrade prior to forming within an aperture defined by the patterned dielectric layer the patterned conductor layer; and (2) a treatment of the aperture with a plasma employing an etchant gas composition comprising hydrogen to form a laterally enlarged aperture prior to forming within the laterally enlarged aperture the patterned conductor layer.

The method of the present invention is readily commercially implemented.

As will be illustrated in greater detail within the context of the Description of the Preferred Embodiment, as set forth below, the present invention employs methods and materials as are generally known in the art of microelectronic fabrication, but employed within the context of specific process limitations to provide a microelectronic fabrication having formed therein a patterned conductor layer formed in accord with the present invention. Since it is thus at least in part a series of specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a damascene method for forming a patterned conductor layer within a microelectronic fabrication, wherein the patterned conductor layer is formed with decreased contact resistance and increased structural integrity.

The present invention realizes the foregoing object within the context of the damascene method for forming the patterned conductor layer by undertaking within the damascene method at least one of: (1) a thermal annealing of a patterned dielectric layer at a temperature of from about 300 to about 450 degrees centigrade prior to forming within an aperture defined by the patterned dielectric layer the patterned conductor layer; and (2) a treatment of the aperture with a plasma employing an etchant gas composition comprising hydrogen to form a laterally enlarged aperture prior to forming within the laterally enlarged aperture the patterned conductor layer.

Although the present invention provides particular value within the context of forming within a semiconductor integrated circuit microelectronic fabrication a contiguous patterned conductor interconnect and patterned conductor stud layer formed within a corresponding trench contiguous with a corresponding via formed through a dielectric layer formed of a comparatively low dielectric constant dielectric material while employing a dual damascene method, the present invention may be employed for forming within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications patterned conductor layers within apertures through dielectric layers formed of dielectric materials including but not limited to comparatively low dielectric constant dielectric materials and comparatively high dielectric constant dielectric materials, while employing damascene methods including but not limited to single damascene methods and dual damascene methods.

Referring now to FIG. 1 to FIG. 5, there is shown a series of schematic cross-sectional diagrams illustrating the results of progressive stages of forming within a microelectronic fabrication, and in accord with a preferred embodiment of the present invention, a patterned conductor layer.

Figure 1:
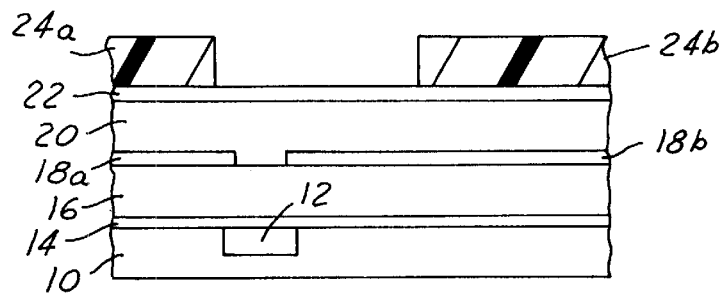
FIG. 1, FIG. 2, FIG. 3, FIG. 4 and FIG. 5 show a series of schematic cross-sectional diagrams illustrating the results of progressive stages of fabricating a microelectronic fabrication having formed therein a patterned conductor layer in accord with a preferred embodiment of the present invention.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiment of the present invention with respect to the substrate 10, and as noted above, the substrate 10 may be employed when fabricating a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed when fabricating the microelectronic fabrication, or in an alternative, the substrate 10 may comprise the substrate as employed when fabricating the microelectronic fabrication, wherein the substrate has formed thereupon and/or thereover any of several additional microelectronic layers as are conventional within the microelectronic fabrication within which is employed the substrate. Similarly with the substrate alone as employed within the microelectronic fabrication, such additional layers may be selected from the group including but not limited to microelectronic conductor layers, microelectronic semiconductor layers and microelectronic dielectric layers.

Similarly, and although also not specifically illustrated within the schematic cross-sectional diagram of FIG. 1, the substrate 10, typically and preferably, but not exclusively, when the substrate 10 consists of or comprises a semiconductor substrate as employed when fabricating a semiconductor integrated circuit microelectronic fabrication, has formed therein and/or thereupon microelectronic devices as are conventional within the microelectronic fabrication within which is employed the substrate. Such microelectronic devices may be selected from the group including but not limited to resistors, transistors, diodes and capacitors.

Within the preferred embodiment of the present invention with respect to the contact region 12, the contact region 12 is typically and preferably either a conductor contact region or a semiconductor contact region within any of the foregoing microelectronic fabrications. When formed as a conductor contact region, the contact region 12 may be formed of conductor materials as are conventional or unconventional within the art of microelectronic fabrication, including but not limited to metal, metal alloy, doped polysilicon (having a dopant concentration greater than about 1E18 dopant atoms per cubic centimeter) and polycide (doped polysilicon/metal silicide stack) conductor materials, with a copper containing conductor material of copper content greater than about 90 percent being particularly preferred within the preferred embodiment of the present invention. Typically and preferably, the contact region 12 has a bidirectional (i.e., areal) linewidth within substrate 10 of from about 0.05 to about 10 microns.

Shown also within the schematic cross-sectional diagram of FIG. 1, and formed upon or over the substrate 10 and the contact region 12, is a series of layers comprising: (1) a blanket first barrier layer 14 formed upon the substrate 10 and the contact region 12; (2) a blanket first dielectric layer 16 formed upon blanket first barrier layer 14; (3) a pair of patterned etch stop layers 18a and 18b formed upon the blanket first dielectric layer 16; (4) a blanket second dielectric layer 20 formed upon exposed portions of the pair of patterned etch stop layers 18a and 18b and the blanket first dielectric layer 16; (5) a blanket polish stop layer 22 formed upon the blanket second dielectric layer 20; and (6) a pair of patterned photoresist layers 24a and 24b formed upon the blanket polish stop layer 22.

Within the preferred embodiment of the present invention with respect to each of the foregoing series of layers formed upon or over the substrate 10 and the contact region 12, and other than the pair of patterned photoresist layers 24a and 24b, each of the foregoing series of layers other than the pair of patterned photoresist layers 24a and 24b is typically and preferably formed of a dielectric material. In general, and although other combinations of dielectric materials are not precluded within the context of the present invention and the preferred embodiment of the present invention, each of the blanket first dielectric layer 16 and the blanket second dielectric layer 20 is typically and preferably formed of a comparatively low dielectric constant dielectric material, such as but not limited to a spin-on-glass (SOG) dielectric material, a spin-on-polymer (SOP) dielectric material, a fluorosilicate glass (FSG) dielectric material or an amorphous carbon dielectric material, each typically and preferably formed to a thickness of from about 1500 to about 8000 angstroms. More typically and preferably, each of the blanket first dielectric layer 16 and the blanket second dielectric layer 20 is formed of a spin-on-polymer (SOP) dielectric material, such as but not limited to a polyimide, a fluorinated polyimide, an arylene ether, a fluorinated arylene ether, a benzocyclobutene or a fluorinated benzocyclobutene spin-on-polymer (SOP) dielectric material formed to the thickness of from about 1500 to about 8000 angstroms.

In addition, with respect to each of the blanket first barrier layer 14, the pair of patterned etch stop layers 18a and 18b and the blanket polish stop 22, each of the blanket first barrier layer 14, the pair of patterned etch stop layers 18a and 18b and the blanket polish stop layer 22 is typically and preferably formed of a denser dielectric material which provides, as appropriate, either barrier properties, etch stop properties or polish stop properties within a microelectronic fabrication derived from additional fabrication of the microelectronic fabrication whose schematic cross-sectional diagram is illustrated in FIG. 1.

For reasons which will become more apparent within the context of the description which follows, within the present invention and the preferred embodiment of the present invention, the pair of patterned etch stop layers 18a and 18b is formed of a dielectric material which provides an effective etch stop when etching the blanket second dielectric layer 20, the blanket first dielectric layer 16 and the blanket first barrier layer 14. Thus, the pair of patterned etch stop layers 18a and 18b and the blanket first barrier layer 14 are typically and preferably formed of different dielectric materials. Similarly, and as will also become clearer within the context of the description which follows, each of the pair of patterned etch stop layers 18a and 18b and the blanket polish stop layer 22 is formed of a dielectric material with inhibited selectivity for etching within a hydrogen containing plasma in comparison with the dielectric material from which is formed the blanket first dielectric layer 16 and the blanket second dielectric layer 20.

Thus, within the present invention and the preferred embodiment of the present invention each of the blanket barrier layer 14, the pair of patterned etch stop layers 18a and 18b and the blanket polish stop layer 22 is typically and preferably formed independently of a dense dielectric material such as but not limited to a silicon nitride dielectric material, a silicon oxynitride dielectric material or a silicon carbide dielectric material, with a silicon carbide dielectric material being particularly preferred for at least one of the foregoing layers. Typically, each of the blanket barrier layer 14, the pair of patterned etch stop layers 18a and 18b and the blanket polish stop layer 22 is formed to a thickness of from about 300 to about 1000 angstroms.

Finally, within the preferred embodiment of the present invention with respect to the pair of patterned photoresist layers 24a and 24b, the pair of patterned photoresist layers 24a and 24b may be formed of photoresist materials are conventional or unconventional in the art of microelectronic fabrication, such conventional photoresist materials being selected from the group including but not limited to positive photoresist materials and negative photoresist materials. Typically and preferably, the pair of patterned photoresist layers 24a and 24b is separated by a bidirectional second aperture of areal dimensions from about 0.4 to about 1.6 microns, while the pair of patterned etch stop layers 18a and 18b is separated by a bidirectional first aperture of areal dimensions from about 0.03 to about 0.15 microns contained within the bidirectional areal dimensions of the second aperture. Thus, and as is understood by a person skilled in the art, although the schematic cross-sectional diagram of FIG. 1 illustrates a separated pair of patterned etch stop layers 18a and 18b and a separated pair of patterned photoresist layers 24a and 24b, the separated pair of patterned etch stop layers 18a and 18b is intended to represent a single patterned etch stop layer defining the first aperture and the separated pair of patterned photoresist layers 24a and 24b is intended to represent a single patterned photoresist layer defining the second aperture.

Figure 2:
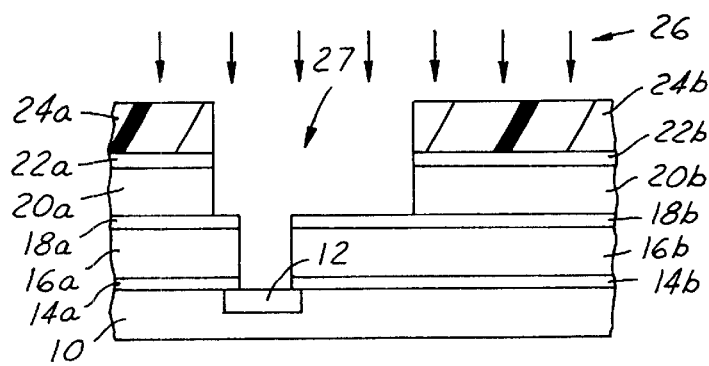

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein successively exposed portions of the blanket polish stop layer 22, the blanket second dielectric layer 20, the blanket first dielectric layer 16 and the blanket first barrier layer 14 have been etched, while employing the pair of patterned photoresist layers 24a and 24b and the pair of patterned etch stop layers 18a and 18b as a mask, and while employing a first etching plasma 26, to form a dual damascene aperture 27 comprising: (1) a via defined by a pair of patterned first barrier layers 14a and 14b having aligned thereupon a pair of patterned first dielectric layers 16a and 16b in turn having aligned thereupon the pair of patterned etch stop layers 18a and 18b; contiguous with (2) a trench defined by a pair of patterned second dielectric layers 20a and 20b having aligned thereupon a pair of patterned polish stop layers 22a and 22b.

Within the preferred embodiment of the present invention with respect to the first etching plasma 26, the first etching plasma 26 typically and preferably employs an etchant gas composition comprising at least one fluorine containing etchant gas, but typically and preferably without an oxygen containing etchant gas with $O_2$, such as to efficiently etch each of the blanket polish stop layer 22, the blanket second dielectric layer 20, the blanket first dielectric layer 16 and the blanket first barrier layer 14, when forming the dual damascene aperture 27, with minimal or no lateral sidewall etching of the resulting patterned layers which define the dual damascene aperture 27.

Within the preferred embodiment of the present invention, the first etching plasma 26 typically and preferably employs an etchant gas composition comprising a perfluorocarbon of up to about four carbon atoms, a hydrofluorocarbon of up to about four carbon atoms, and an inert sputter gas component such as argon. Similarly, typically and preferably, the first etching plasma 26 also employs, with respect to an eight inch diameter substrate 10: (1) a reactor chamber pressure of from about 10 mT to about 150 mT; (2) a source radio frequency power of from about 200 to about 1000 watts; (3) a bias sputtering power of from about 50 to about 500 watts; (4) a substrate (and overlying layers) temperature of from about 10 to about 100 degrees centigrade; (5) a carbon tetrafluoride perfluorocarbon etchant gas flow rate of from about 10 to about 100 standard cubic centimeters per minute (sccm); (6) a trifluoromethane hydrofluorocarbon etchant gas flow rate of from about 10 to about 100 standard cubic centimeters per minute (sccm); and (6) an argon sputter gas component flow rate of from about 50 to about 200 standard cubic centimeters per minute (sccm).

Figure 3:
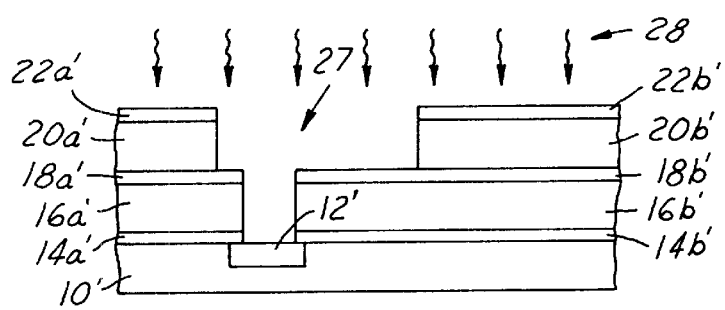

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, there has been stripped from the pair of patterned polish stop layers 22a and 22b the pair of patterned photoresist layers 24a and 24b.

Within the preferred embodiment of the present invention, the pair of patterned photoresist layers 24a and 24b may be stripped from the pair of patterned polish stop layers 22a and 22b to form in part the microelectronic fabrication whose schematic cross-sectional diagram is illustrated in FIG. 3 from the microelectronic fabrication whose schematic cross-sectional diagram is illustrated in FIG. 2 while employing photoresist stripping methods as are conventional in the art of microelectronic fabrication.

Shown also within the schematic cross-sectional diagram of FIG. 3 is the results of thermally annealing the resulting microelectronic fabrication within a thermal annealing environment 28 to form from each of the substrate 10, the contact region 12 and the series of pairs of layers comprising the pair of patterned first barrier layers 14a and 14b, the pair of patterned first dielectric layers 16a and 16b, the pair of patterned first etch stop layers 18a and 18b, the pair of patterned second dielectric layers 20a and 20b and the pair of patterned polish stop layers 22a and 22b a corresponding thermally annealed substrate 10' having formed therein a thermally annealed contact region 12' in turn having formed thereover in layered sequence a pair of thermally annealed patterned first barrier layers 14a' and 14b', a pair of thermally annealed patterned first dielectric layers 16a' and 16b', a pair of thermally annealed patterned etch stop layers 18a' and 18b', a pair of thermally annealed patterned second dielectric layers 20a' and 20b' and a pair of thermally annealed patterned polish stop layers 22a' and 22b'.

Within the preferred embodiment of the present invention, the thermal annealing environment 28 is typically and preferably provided at a temperature of from about 300 to about 450 degrees centigrade, more preferably from about 300 to about 400 degrees centigrade and most preferably from about 350 to about 400 degrees centigrade, within a vacuum evacuated to about 10 mTorr to about 100 mTorr, more preferably from about 50 mTorr to about 100 mTorr and most preferably from about 60 mTorr to about 100 mTorr, and with a non-oxidizing backfilling gas, such as argon, nitrogen or forming gas (i.e., hydrogen/nitrogen mixture) for a time period of from about 5 to about 60 seconds, more preferably from about 5 to about 20 seconds and most preferably from about 10 to about 15 seconds.

As is understood by a person skilled in the art, by employing within the context of the present invention and the preferred embodiment of the present invention the thermal annealing of the microelectronic fabrication whose schematic cross-sectional diagram is illustrated in FIG. 3 within the thermal annealing environment 28, there is effectively thermally degassed various of the layers which are employed for fabricating the microelectronic fabrication whose schematic cross sectional diagram is illustrated in FIG. 2, and in particular the pair of patterned first dielectric layers 16a and 16b and the pair of patterned second dielectric layers 20a and 20b as illustrated within the schematic cross-sectional diagram of FIG. 2, when forming therefrom the pair of thermally annealed patterned first dielectric layers 16a' and 16b' and the pair of thermally annealed patterned second dielectric layers 20a' and 20b', as illustrated within the schematic crosssectional diagram of FIG. 2.

As a result of the foregoing thermal annealing induced degassing at the elevated temperature in accord with the present invention, a contiguous patterned conductor interconnect layer and patterned conductor stud layer may subsequently be formed within the dual damascene aperture 27, with decreased contact resistance.

Figure 4:
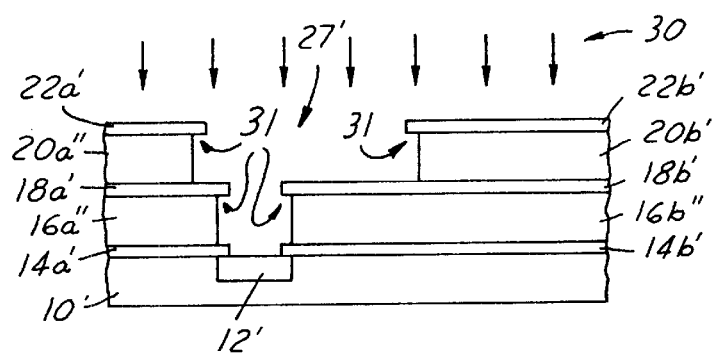

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein: (1) the pair of pair of thermally annealed patterned second dielectric layers 20a' and 20b' has been recessed beneath the pair of thermally annealed polish stop layers 22a' and 22b' to form a pair of recessed thermally annealed patterned second dielectric layers 20a" and 20b" and a pair of recesses 31; and (2) the pair of thermally annealed patterned first dielectric layers 16a' and 16b' has been recessed beneath the pair of thermally annealed patterned etch stop layers 18a' and 18b' to form a pair of recessed thermally annealed patterned first dielectric layers 16a' and 16b' and an additional pair of recesses 31, through etching within a second etching plasma 30.

Within the present invention and the preferred embodiment of the present invention, the second etching plasma 30 typically and preferably employs an etchant gas composition comprising a hydrogen containing etchant gas such as but not limited to hydrogen (i.e., molecular hydrogen) or ammonia, but not comprising molecular nitrogen, such as to provide the recesses 31 as described above and illustrated within the schematic cross-sectional diagram of FIG. 1. More preferably, the etchant gas composition consists of hydrogen and/or ammonia. Most preferably, the etchant gas composition consists of hydrogen.

Typically and preferably, the second etching plasma 30 also employs with respect to an eight inch diameter substrate 10: (1) a reactor chamber pressure of from about 60 to about 120 torr; (2) a source radio frequency power of from about 400 to about 500 watts without a bias sputtering power; (3) a substrate (and thermally annealed layers formed thereover) temperature of from about 20 to about 100 degrees centigrade; and (4) a hydrogen flow rate of from about 50 to about 150 standard cubic centimeters per minute (sccm).

Typically and preferably each of the recesses 31 as illustrated within the schematic cross-sectional diagram of FIG. 4 comprises a lateral distance of from about 50 to about 500 angstroms beneath the pair of thermally annealed patterned etch stop layers 18a' and 18b' or the pair of thermally annealed patterned polish stop layers 22a' and 22b'. Similarly, and incident to forming the series of recesses 31 as illustrated within the schematic cross-sectional diagram of FIG. 4, there is formed from the dual damascene aperture 27 as illustrated within the schematic cross-sectional diagram of FIG. 2 and FIG. 3 a laterally enlarged dual damascene aperture 27' as illustrated within the schematic cross-sectional diagram of FIG. 4.

Figure 5:
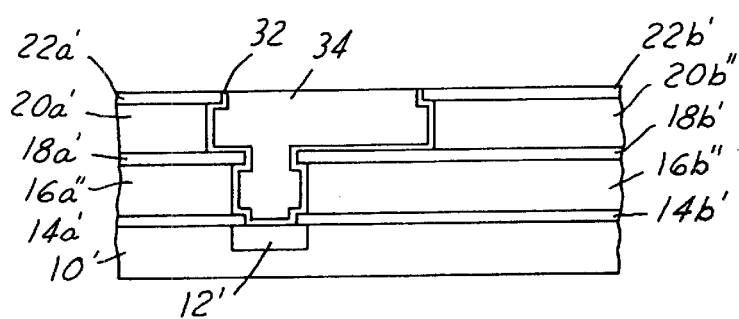

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein there is formed into the laterally enlarged dual damascene aperture 27' a patterned second barrier layer 32 having formed thereupon a contiguous patterned conductor interconnect and patterned conductor stud layer 34.

Within the present invention and the preferred embodiment of the present invention, each of the patterned second barrier layer 32 and the contiguous patterned conductor interconnect and patterned conductor stud layer 34 may be formed employing materials as are conventional or unconventional in the art of microelectronic fabrication, but will in particular be formed employing a dual damascene method.

Within the preferred embodiment of the present invention, typically and preferably, the patterned second barrier layer 32 is typically and preferably formed of a barrier material such as but not limited to a titanium, titanium nitride, tantalum or tantalum nitride barrier material, formed to a thickness of from about 20 to about 400 angstroms. Similarly, within the present invention and the preferred embodiment of the present invention, the contiguous patterned conductor interconnect and patterned conductor stud layer 34 is typically and preferably formed from a blanket conductor layer, preferably formed of a blanket copper containing conductor material, formed to a thickness of from about 3000 to about 8000 angstroms and subsequently chemical mechanical polish (CMP) planarized along with a blanket second barrier layer from which is formed the patterned second barrier layer 32.

As is understood by a person skilled in the art, by virtue of the presence of the series of recesses 31 as illustrated within the schematic cross-sectional diagram of FIG. 4, the patterned second barrier layer 32 and the contiguous patterned conductor interconnect and patterned conductor stud layer 34 are held with enhanced structural integrity within the laterally enlarged dual damascene aperture 27' as illustrated within the schematic cross-sectional diagram of FIG. 4.

As is understood by a person skilled in the art, although the preferred embodiment of the present invention illustrates the present invention within the context of a thermal annealing of a microelectronic fabrication having formed therein a dual damascene aperture prior to etching the dual damascene aperture to form a laterally enlarged dual damascene aperture, in turn prior to filling the laterally enlarged dual damascene aperture with a contiguous patterned conductor interconnect and patterned conductor stud layer, a reverse ordering of the lateral etching enlargement of the dual damascene aperture of the thermal annealing of the microelectronic fabrication is also within the context of the present invention.

As is further understood by a person skilled in the art, and although also not illustrated within the context of the preferred embodiment of the present invention, it is also feasible within the present invention to further treat the microelectronic fabrication whose schematic cross-sectional diagram is illustrated in FIG. 4 with an argon sputtering prior to forming therefrom the microelectronic fabrication whose schematic cross-sectional diagram is illustrated in FIG. 5. Under such circumstances, there will typically be provided a dulling of the edges of the pair of thermally annealed patterned polish stop layers 22a' and 22b' and the pair of thermally annealed patterned etch stop layers 18a' and 18b', which in turn provides for attenuation, but not elimination, of the recesses 31 as illustrated within the schematic cross-sectional diagram of FIG. 4.

Upon forming the microelectronic fabrication whose schematic cross-sectional diagram is illustrated in FIG. 5, there is formed a microelectronic fabrication having formed therein a patterned conductor layer within an aperture defined by a patterned dielectric layer, with decreased contact resistance and enhanced structural integrity. The present invention realizes the foregoing object by employing at least one of: (1) a thermal annealing of a microelectronic fabrication having formed therein an aperture within a patterned dielectric layer to sufficiently degas the patterned dielectric layer; and (2) a hydrogen containing plasma treatment of the patterned dielectric layer to provide a laterally enlarged and undercut aperture from the aperture, prior to forming within the aperture or laterally enlarged aperture the patterned conductor layer while employing a damascene method.

EXAMPLE

There was provided two microelectronic fabrications generally in accord with the microelectronic fabrication whose schematic cross-sectional diagram is illustrated in FIG. 2. The pair of microelectronic fabrications employed for forming a pair of patterned first dielectric layers and a pair of patterned second dielectric layers an organic polymer low dielectric constant dielectric material provided by Dow Chemical Co. as SiLK brand low dielectric constant dielectric material. Each of the pair of patterned first dielectric layers and the pair of patterned second dielectric layers was formed to a thickness of about 3500 angstroms beneath either a pair of patterned etch stop layers or a pair of patterned polish stop layers.

One of the microelectronic fabrications was then thermally annealed at a temperature of about 250 degrees centigrade for a time period of about 1 minutes within a vacuum atmosphere at a pressure of about 0.01 torr and then sputter cleaned employing an argon ion sputtering method at a reactor chamber pressure of about 0.08 torr, a bias sputtering power of about 100 watts, a substrate temperature of about 25 degrees centigrade and an argon flow rate of about 20 standard cubic centimeters per minute (sccm).

The other of the microelectronic fabrications was thermally annealed at a temperature of about 400 degrees centigrade, rather than about 250 degrees centigrade, but otherwise in accord with the above thermal annealing parameters, and also treated with a hydrogen plasma prior to the argon sputter cleaning as described above. The hydrogen plasma employed a reactor chamber pressure of about 0.08 torr, a radio frequency power of about 450 watts (without a bias sputtering power), a substrate temperature of about 25 degrees centigrade and a hydrogen flow rate of about 100 standard cubic centimeters per minute (sccm).

Each of the microelectronic fabrications was then fabricated to completion while employing a dual damascene method to form a series of patterned barrier layers and a series of copper containing contiguous patterned conductor interconnect and patterned conductor stud layers within a series of dual damascene apertures within each of the microelectronic fabrications.

Contact resistance measurements were then obtained with respect to the two microelectronic fabrications. The results indicated a contact resistance yield of about 62 percent for the microelectronic fabrication not fabricated in accord with the present invention and a contact resistance yield of about 90 percent for the microelectronic fabrication fabricated in accord with the present invention.

As is understood by a person skilled in the art, the preferred embodiment of the present invention is illustrative of the present invention rather than limiting of the present invention. Revisions and modifications may be made to methods, materials, structures and dimensions through which is provided a microelectronic fabrication in accord with the preferred embodiment of the present invention, while still providing a microelectronic fabrication in accord with the present invention, further in accord with the accompanying claims.

What is claimed is:

1. A damascene method for forming a patterned conductor layer within a microelectronic fabrication comprising:
   providing a substrate;
   forming over the substrate a blanket first dielectric layer;
   patterning the blanket first dielectric layer to form a patterned first dielectric layer which defines an aperture;
   etching the aperture with a plasma employing an etchant gas composition comprising a hydrogen containing etchant gas without molecular nitrogen to form a laterally enlarged aperture; and
   forming into the laterally enlarged aperture a patterned conductor layer while employing a damascene method.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein blanket first dielectric layer is formed from a dielectric material selected from the group consisting of spin-on-glass (SOG) dielectric materials, spin-on-polymer (SOP) dielectric materials, fluorosilicate glass (FSG) dielectric materials and amorphous carbon dielectric materials.

4. The method of claim 1 wherein the blanket first dielectric layer is formed to a thickness of from about 1500 to about 8000 angstroms.

5. The method of claim 3 wherein the blanket first dielectric layer is patterned to form the patterned first dielectric layer while employing an additional plasma etch method employing an etchant gas composition comprising at least one fluorine containing etchant gas without an oxygen containing etchant gas.

6. The method of claim 1 further comprising forming a second dielectric layer upon the blanket first dielectric layer, where incident to forming the patterned first dielectric layer from the blanket first dielectric layer there is formed a patterned second dielectric layer upon and aligned with the patterned first dielectric layer.

7. The method of claim 6 wherein incident to forming the laterally enlarged aperture the patterned first dielectric layer is laterally recessed beneath the patterned second dielectric layer.

8. The method of claim 1 wherein the hydrogen containing etchant gas is selected from the group consisting of hydrogen and ammonia.

9. A damascene method for forming a patterned conductor layer within a semiconductor integrated circuit microelectronic fabrication comprising:

provided a semiconductor substrate;

forming over the semiconductor substrate a blanket first dielectric layer;

patterning the blanket first dielectric layer to form a patterned first dielectric layer which defines an aperture;

etching the aperture with a plasma employing an etchant gas composition comprising a hydrogen containing etchant gas without molecular nitrogen to form a laterally enlarged aperture; and forming into the laterally enlarged aperture a patterned conductor layer while employing a damascene method.

10. The method of claim 9 wherein blanket first dielectric layer is formed from a dielectric material selected from the group consisting of spin-on-glass (SOG) dielectric materials, spin-on-polymer (SOP) dielectric materials, fluorosilicate glass (FSG) dielectric materials and amorphous carbon dielectric materials.

11. The method of claim 10 wherein the blanket first dielectric layer is patterned to form the patterned first dielectric layer while employing an additional plasma etch method employing an etchant gas composition comprising at least one fluorine containing etchant gas without an oxygen containing etchant gas.

12. The method of claim 9 wherein the blanket first dielectric layer is formed to a thickness of from about 1500 to about 8000 angstroms.

13. The method of claim 9 further comprising forming a second dielectric layer upon the blanket first dielectric layer, where incident to forming the patterned first dielectric layer from the blanket first dielectric layer there is formed a patterned second dielectric layer upon and aligned with the patterned first dielectric layer.

14. The method of claim 13 wherein incident to forming the laterally enlarged aperture the patterned first dielectric layer is laterally recessed beneath the patterned second dielectric layer.

15. The method of claim 9 wherein the hydrogen containing etchant gas is selected from the group consisting of hydrogen and ammonia.

16. A damascene method for forming a patterned conductor layer within a microelectronic fabrication comprising:

providing a substrate;

forming over the substrate a blanket dielectric layer;

patterning the blanket dielectric layer to form a patterned dielectric layer which defines an aperture; and forming into the aperture a patterned conductor layer while employing a damascene method, wherein the patterned dielectric layer is thermally annealed at a temperature of from about 300 to about 450 degrees centigrade prior to forming into the aperture the patterned conductor layer.

17. The method of claim 16 wherein the patterned dielectric layer is thermally annealed within a non-oxidizing atmosphere.

18. The method of claim 16 wherein the non-oxidizing atmosphere is selected from the group consisting of argon, nitrogen and forming gas atmospheres.

19. The method of claim 16 further comprising etching the aperture with a plasma employing an etchant gas composition comprising a hydrogen containing etchant gas without molecular nitrogen to form a laterally enlarged aperture prior to forming within the laterally enlarged aperture the patterned conductor layer.

20. The method of claim 19 wherein the hydrogen containing etchant gas is selected from the group consisting of hydrogen and ammonia.

* * * * *